(12) United States Patent
Goodman

(10) Patent No.: US 7,435,102 B2
(45) Date of Patent: Oct. 14, 2008

(54) INTERCONNECTING ELECTRICAL DEVICES

(75) Inventor: Glenn Goodman, Cumberland, RI (US)

(73) Assignee: Advanced Interconnections Corporation, West Warwick, RI (US)

( * ) Notice: Subject to any disclaimer, the term of this patent is extended or adjusted under 35 U.S.C. 154(b) by 0 days.

(21) Appl. No.: 11/604,961

(22) Filed: Nov. 28, 2006

(65) Prior Publication Data

US 2007/0082515 A1    Apr. 12, 2007

Related U.S. Application Data

(63) Continuation-in-part of application No. 11/065,015, filed on Feb. 24, 2005.

(51) Int. Cl.
*H01R 12/00*  (2006.01)

(52) U.S. Cl. .............. 439/70; 439/71; 439/66; 361/813

(58) Field of Classification Search ............. 439/70–73, 439/82, 66, 825, 792; 361/789, 792
See application file for complete search history.

(56) References Cited

U.S. PATENT DOCUMENTS

| | | | |
|---|---|---|---|
| 1,334,084 A | | 3/1920 | Dorsey |
| 2,453,172 A | | 11/1948 | Wilkie |
| 3,065,450 A | | 11/1962 | Fieberg |
| 3,286,671 A | | 11/1966 | Fuller |
| 3,531,750 A | * | 9/1970 | Malcolm et al. ............. 336/135 |
| 3,579,282 A | | 5/1971 | Couper |
| 3,675,189 A | | 7/1972 | Smith |
| 4,442,938 A | | 4/1984 | Murphy |
| 4,482,937 A | * | 11/1984 | Berg ........................... 361/789 |
| RE32,540 E | | 11/1987 | Murphy |
| 4,750,890 A | | 6/1988 | Dube et al. |
| 4,820,207 A | * | 4/1989 | Zic .............................. 439/825 |
| 4,886,474 A | * | 12/1989 | Drogo ......................... 439/856 |
| 5,038,467 A | | 8/1991 | Murphy |
| 5,076,794 A | | 12/1991 | Ganthier |
| 5,088,930 A | | 2/1992 | Murphy |
| 5,139,427 A | * | 8/1992 | Boyd et al. .................... 439/66 |
| 5,151,040 A | | 9/1992 | Tanaka |
| 5,197,908 A | | 3/1993 | Nelson |
| 5,227,718 A | | 7/1993 | Stowers et al. |
| 5,420,519 A | | 5/1995 | Stowers et al. |
| 5,482,480 A | * | 1/1996 | Miyazaki ..................... 439/774 |
| 5,545,050 A | | 8/1996 | Sato et al. |
| 5,575,694 A | | 11/1996 | Hawkins et al. |
| 5,576,631 A | | 11/1996 | Stowers et al. |
| 5,877,554 A | | 3/1999 | Murphy |
| 6,007,348 A | * | 12/1999 | Murphy ......................... 439/70 |
| 6,020,635 A | | 2/2000 | Murphy |
| 6,036,540 A | * | 3/2000 | Beloritsky .................... 439/582 |
| 6,190,181 B1 | | 2/2001 | Affolter et al. |

(Continued)

*Primary Examiner*—Tulsidas C. Patel
*Assistant Examiner*—Harshad C Patel
(74) *Attorney, Agent, or Firm*—Occhiuti Rohlicek & Tsao LLP

(57) ABSTRACT

A male contact having a longitudinal axis includes a head configured to contact a corresponding electrical contact and a first portion extending along the longitudinal axis and configured to be received within a socket of a corresponding terminal assembly. The first portion comprises resilient members extending axially from the head, the resilient members defining an interior cavity within the male contact, at least one of the resilient members having an arcuate inner surface in parallel with the longitudinal axis of the corresponding male contact.

29 Claims, 10 Drawing Sheets

U.S. PATENT DOCUMENTS

| | | |
|---|---|---|
| 6,190,215 B1 * | 2/2001 | Pendleton et al. ............ 439/853 |
| 6,213,787 B1 | 4/2001 | Murphy |
| 6,313,530 B1 * | 11/2001 | Murphy ....................... 257/727 |
| 6,341,962 B1 | 1/2002 | Sinclair |
| 6,352,437 B1 | 3/2002 | Tate |
| 6,390,826 B1 | 5/2002 | Affolter et al. |
| 6,471,524 B1 | 10/2002 | Nakano et al. |
| 6,491,527 B1 | 12/2002 | Smith |
| 6,585,527 B2 * | 7/2003 | Koopman et al. ............. 439/71 |
| 6,843,659 B2 * | 1/2005 | Liao et al. ..................... 439/66 |
| 6,942,495 B2 * | 9/2005 | Liao et al. ..................... 439/66 |
| 6,957,964 B2 * | 10/2005 | Chiang ......................... 439/66 |
| 6,969,263 B2 * | 11/2005 | Chen et al. .................... 439/66 |
| 7,115,005 B2 * | 10/2006 | Zhu et al. .................... 439/862 |
| 7,134,880 B2 * | 11/2006 | Arai et al. ..................... 439/66 |
| 7,186,119 B2 * | 3/2007 | Perugini ....................... 439/66 |
| 7,189,080 B2 * | 3/2007 | Tang et al. ................... 439/66 |
| 2002/0182901 A1 * | 12/2002 | Koopman et al. ............. 439/71 |
| 2004/0102062 A1 * | 5/2004 | Liao et al. ..................... 439/66 |
| 2004/0203264 A1 * | 10/2004 | Liao et al. ..................... 439/66 |
| 2004/0235316 A1 * | 11/2004 | Liao et al. ..................... 439/66 |

* cited by examiner

INTERCONNECTING ELECTRICAL DEVICES

CROSS-REFERENCE TO RELATED APPLICATIONS

This application is a continuation-in-part application of and claims priority to U.S. application Ser. No. 11/065,015, filed Feb. 24, 2005, the entire contents of which are hereby fully incorporated by reference.

TECHNICAL FIELD

This invention relates to making connections between integrated circuit (IC) array packages and circuit boards.

BACKGROUND

Ball grid array (BGA) and land grid array (LGA) packages are becoming increasingly popular because of their low profiles and high densities. With a BGA package, for example, the rounded solder balls of the BGA are generally soldered directly to corresponding surface mount pads of a printed circuit board rather than to plated thru-holes which receive pins from, for example, a pin grid array IC package.

Sockets are used to allow particular IC packages to be interchanged without permanent connection to a circuit board. More recently, sockets for use with BGA and LGA packages have been developed to allow these packages to be non-permanently connected (e.g., for testing) to a circuit board. It is desirable that such sockets present a low-profile.

Mating connectors can also be used to provide semi-permanent connections between electrical components. For example, a connector can be soldered to a first electrical component and a mating connector can be soldered to modules intended for use with the first electrical component that are manufactured separately. The mating connectors can then provide convenient subsequent attachment of a chosen module to the first electrical component. It is desirable that such connectors present a low profile and provide high connection density.

SUMMARY

Connector assemblies can be formed with male contacts that include resilient members. In some embodiments, the male contacts are of unitary construction. In other embodiments, the male contacts include a first portion with resilient members joined to a separately produced base portion.

In one aspect, connector assemblies of the type used to electrically connect electrical devices includes: a first insulating support member including a first array of apertures, each aperture of the first array extending from an first surface of the first insulating support member to an opposite second surface of the first insulating support member, each aperture of the first array configured to receive a male contact; and a plurality of male contacts for providing electrical connections arranged in a configuration corresponding with the first array of apertures, each male contact received within an opening of a corresponding aperture of the first array of apertures of the first insulating support member, each male contact having a head configured to contact a corresponding electrical contact and a first portion configured to be at least partially received within a socket of a corresponding terminal assembly. The first portion includes a plurality of resilient members extending axially from the head, the resilient members defining an interior cavity within the male contact, at least one of the resilient members having an arcuate inner surface.

In another aspect, male contacts include: a head configured to contact a corresponding electrical contact and a first portion configured to be received within a socket of a corresponding terminal assembly. The first portion comprises a plurality of resilient members extending axially from the head, the resilient members defining an interior cavity within the male contact, at least one of the resilient members having an arcuate inner surface.

Embodiments of the connector assemblies and male contacts can include one or more of the following features.

In some embodiments, connector assemblies also include a plurality of sockets, the plurality of sockets for providing electrical connections arranged in a configuration corresponding with a second array of apertures included in the first insulating support member, each socket received within an opening of a corresponding aperture of the second array of apertures of the first insulating support member, each socket having an interior cavity configured to at least partially receive a male contact of the corresponding terminal assembly. Each aperture of the second array can extend from the first surface of the first insulating support member to the opposite second surface of the first insulating support member In some embodiments, at least one of the resilient members comprises a projection extending radially outward from the resilient member. The projection can be disposed on the resilient member at location spaced apart from the head of the male contact.

In some embodiments, the resilient members of each male contact are biased towards unconstrained positions in which the arcuate inner surfaces of the resilient members are substantially parallel to a longitudinal axis of the male contact.

In some embodiments, the first portion is integrally formed with the head.

In some embodiments, the first portion is attached to the head. In some cases, at least a portion of the head is received within the first portion. In some cases, at least a portion of the first portion is received within the head.

In some embodiments, at least one of the male contacts has a circular cross-section.

In some embodiments, a first resilient member of the first portion has a first length and a second resilient member of the first portion has a second length that is different than the first length.

In another aspect, methods of manufacturing an electrical connector include: forming a male contact by attaching a head configured to contact a corresponding electrical contact to a first portion comprising a plurality of resilient members, the resilient members defining an interior cavity within the male contact, each resilient member having an arcuate inner surface, the first portion sized and configured to be received in a corresponding female contact.

Embodiments of methods can include one or more of the following features.

In some embodiments, methods also include: forming a plurality of male contacts, forming each male contact by attaching a head configured to contact a corresponding electrical contact to a first portion comprising a plurality of resilient members, the resilient members defining an interior cavity within the male contact, each resilient member having an arcuate inner surface, the first portion sized and configured to be received in a corresponding female contact. In some cases, methods also include: installing the plurality of male contacts in an array of first apertures, each first aperture extending from an first surface of a first insulating support member to an opposite second surface of the first insulating support member. Methods can also include: installing a plurality of female contacts in an array of second apertures, each second aperture extending from the first surface of the first insulating support member to the opposite second surface of the first insulating support member.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
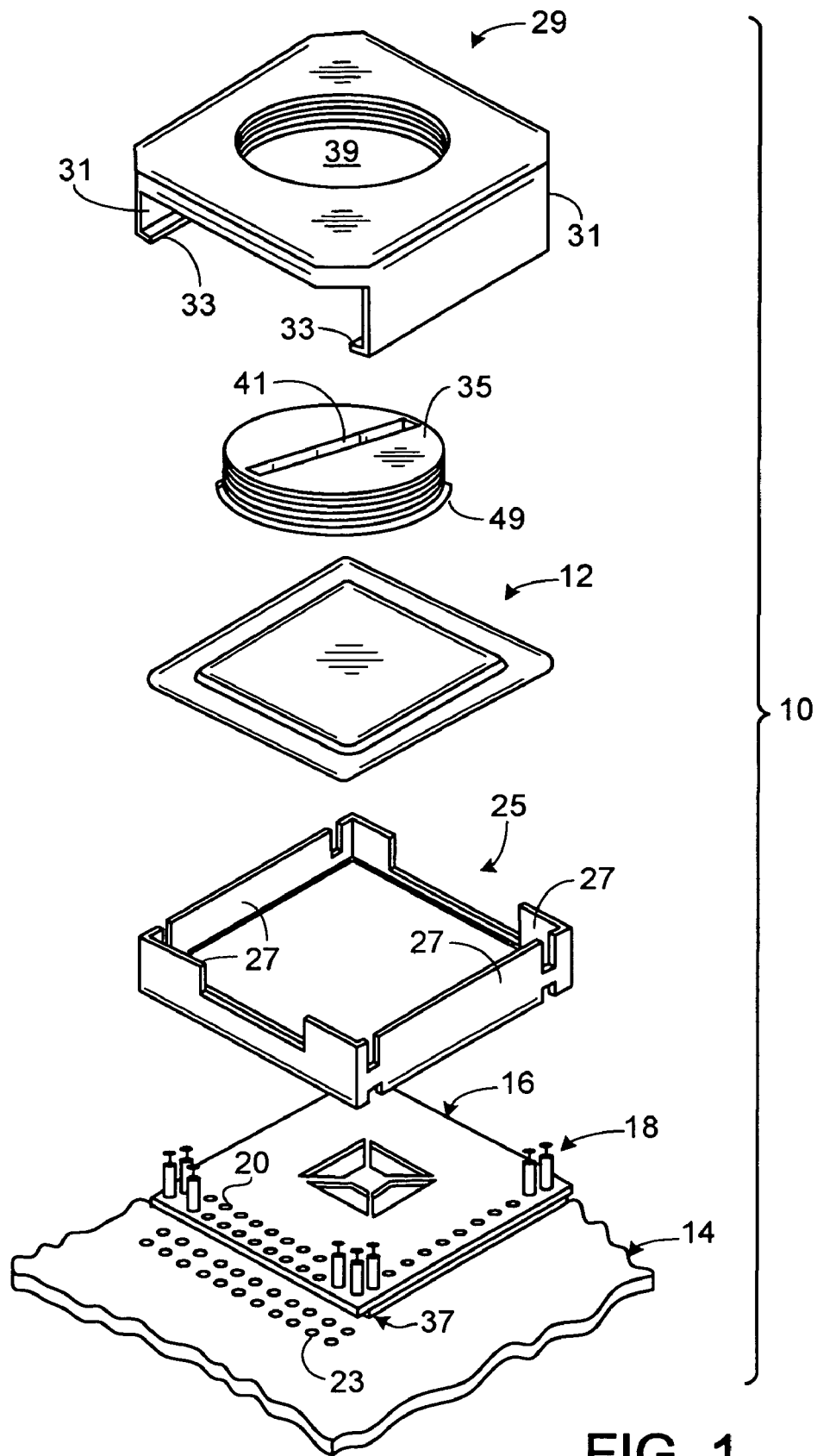
FIG. 1 is an exploded, somewhat diagrammatic view of a socket converter assembly, an integrated circuit package, and a hold-down assembly positioned over a printed circuit board.

Referring to FIG. 1, a socket converter assembly 10 serves as a component for intercoupling a integrated circuit package 12 to a printed circuit board 14. Socket converter assembly 10 includes an electrically insulative member 16 for supporting socket terminal assemblies 18, each of which is press-fit within a corresponding one of an array of holes 20 in the insulative member. The array of holes 20 are provided in a pattern corresponding to a footprint of contact areas 22 (FIGS. 2A and 2B) of integrated circuit package 12 as well as a footprint of surface mount pads 23 of printed circuit board 14. Insulative member 16 with socket terminal assemblies 18 is press-fit into a guide box 25 having sidewalls 27 along which the peripheral edges of integrated circuit package 12 are guided so that contact areas 22 are aligned over socket terminal assemblies 18. Insulative member 16 and guide box 25 may be formed as a one-piece, integral unit.

Socket converter assembly 10 also includes a hold-down cover 29 for securing the integrated circuit package 12 into the socket converter assembly. Cover 29 includes a pair of opposite walls 31 having tab members 33 which engage recessed portions 37 along the underside of insulative member 16. Hold-down cover 29 includes a threaded thru-hole 39 which threadingly receives a heat sink 35 to provide a thermal path for dissipating heat from the IC device generated within integrated circuit package 12. Heat sink 35 is inserted and backed-in from the bottom of the cover 29 and includes a lip 49 which engages a flat counterbored surface (not shown) on the bottom surface of the cover to ensure that the heat sink will contact the surface of the integrated circuit package. A slot 41 formed in the heat sink facilitates threading the heat sink within the cover, for example, with a screwdriver or coin. Other latching mechanisms (e.g., clips or catches) may also be used to secure integrated circuit packages within the socket converter assembly. It is also appreciated that other heat sink arrangements, including those with increased surface area (e.g. heat sinks with finned arrangements), may be substituted for the lower profile version shown in FIG. 1. In some applications, a heat sink may not be required with only the cover providing the downward compressing force to the integrated circuit package.

Figure 2A:
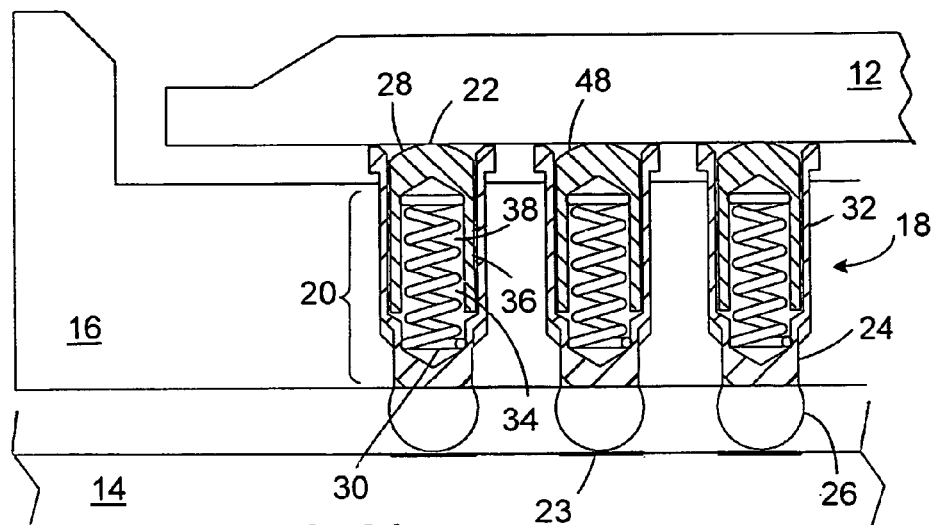
FIGS. 2A-2B are cross-sectional side views of a portion of the socket converter assembly of FIG. 1 with socket terminal assemblies each including a socket shell, a coiled spring, and a pin.
Figure 2B:
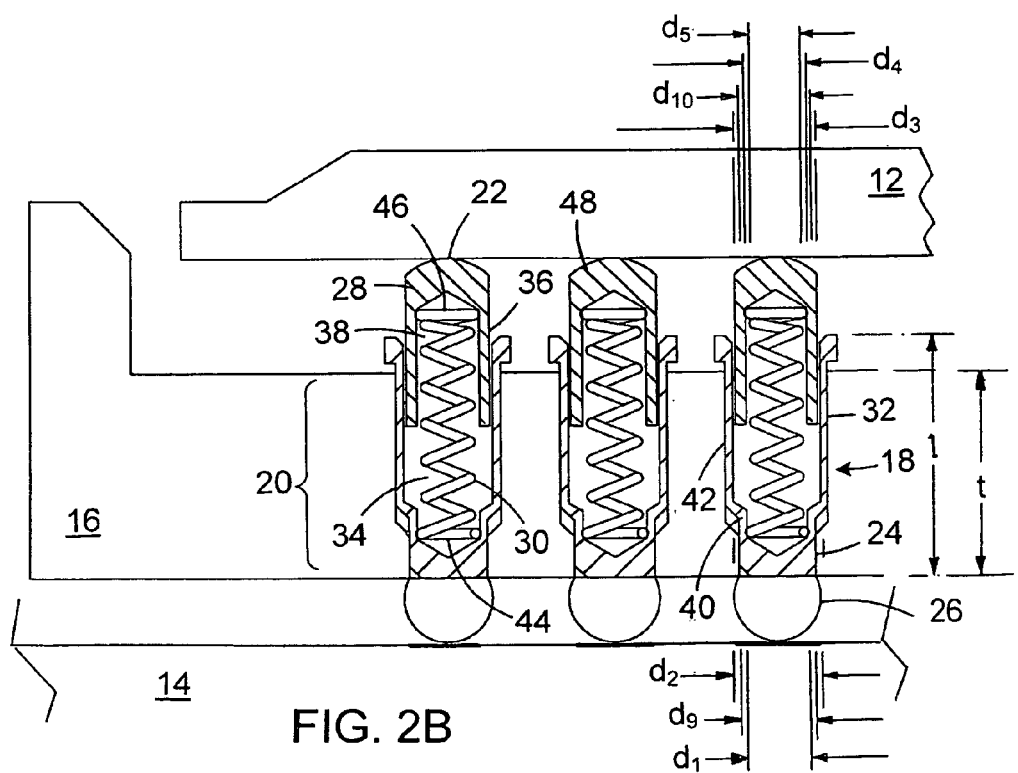

Referring to FIGS. 2A and 2B, socket terminal assemblies 18 extend upward from surface mount pads 23 of printed circuit board 14 through holes 20 to contact areas 22 of integrated circuit package 12. In this description, the directional terms upper, lower, upward, and downward are used assuming that the integrated circuit package is located "above" the substrate. This assumption and the use of these terms are for ease of description only and do not imply any limitation in the absolute vertical location of the components relative to each other. Each socket terminal assembly 18 has a socket shell 24 with an attached solder ball 26, a pin 28, and a coiled spring 30. In other embodiments, the socket terminal assemblies can have a solder tail for thru-hole applications. The upper end 32 of the socket shell 24 defines an open shell cavity 34 and the lower end 36 of the pin 28 defines an open pin cavity 38. The opening of the shell cavity 34 faces the opening of the pin cavity with the coiled spring interposed between the socket shell 24 and the pin 28.

The shell cavity 34 has a first section 40 with a first inner diameter d1 of approximately 0.012 inch and a second section 42 with a second inner diameter d2 of approximately 0.017 inch. The pin 28 is generally cylindrical in shape and has an outer diameter d3 of approximately 0.016 inch. The pin 28 is at least partially received within the shell cavity 34. The pin cavity 38 has a third inner diameter d4 of approximately 0.012 inch. The lower end section 44 of the coiled spring 30 has an unconstrained first spring diameter (d9) that exceeds the first inner diameter d1 of the shell cavity 34. Similarly, the upper end section 46 of the spring has an unconstrained second spring diameter (d10) that exceeds the third inner diameter d4 of the pin cavity 38. The term "unconstrained spring diameter" indicates the outer diameter that a portion of a spring would have in the absence of external forces. These "diameters" are used to indicate the relative cross-sectional areas rather than to limit the described components to circular configurations.

The coiled spring 30 is press-fit between the socket shell 24 and the pin 28 which radially compresses the spring lower end section 44 to fit within the first section 40 of the socket shell 24 and the spring upper end section 46 to fit within the pin cavity 38. This produces an engagement of the coiled spring 30 with the socket shell 24 and the pin 28 that holds the socket terminal assembly 18 together even as the coiled spring 30 biases the socket shell 24 and the pin 28 away from each other. Although the spring end sections 44, 46 of this socket terminal assembly are the last coils on either end of coiled spring 30, the spring end sections in other socket terminal assemblies can include multiple, rather than single, coils.

As both the coiled spring 30 and pin 28 are received within the socket shell 24, the height of the socket terminal assembly 18 is determined by length 1 of the socket shell 24, in this case, approximately 0.047 inch. It is anticipated that this socket shell assembly can be produced with a height of less than about 0.0060 inch. The minimum height of the socket shell 24 is constrained by the thickness t of the electrically insulative member 16 which supports the socket shell 24. The electrically insulative member 16 in this embodiment is formed of a glass laminate available under tradename FR-4 from Industrial Laminates/Norplex, Inc. of Postville, Iowa and has a thickness of approximately 0.040 inch. The minimum thickness t thought to provide adequate structural support for the socket terminal assemblies 18 is approximately 0.040 inch but may be less using other materials.

Intermediate coils between the spring end sections 44, 46 have a third spring diameter d5 that is less than either the first spring diameter or the second spring diameter even if the coiled spring 30 is compressed so that the pin 28 is completely received within the socket shell 24 (see FIG. 2A). These intermediate coils typically do not engage or even touch the socket shell 24 or pin 28. Consequently, the biasing effect of the coiled spring 30 expands the socket terminal assembly 18 to compensate for minor variations in the integrated circuit package surface or vertical positioning and to maintain an electrical connection between the substrate 14 and the integrated circuit package 12 (see FIG. 2B).

Electrical current flows between the integrated circuit package 12 and substrate 14 through the pin 28, coiled spring 30, socket shell 24, and solder ball 26. The coiled spring 30 is made of Type 302 stainless steel but can be made from other materials with similar mechanical and electrical properties including, for example, beryllium-copper alloys. The head 48 of the pin 28 is a surface that contacts the predominantly flat contacting area 22 of LGA integrated circuit package 12. Under some conditions, sufficient contact occurs between the pin 28 and the socket shell 24 to advantageously provide a direct path for current to flow between these two components.

Figure 3A:
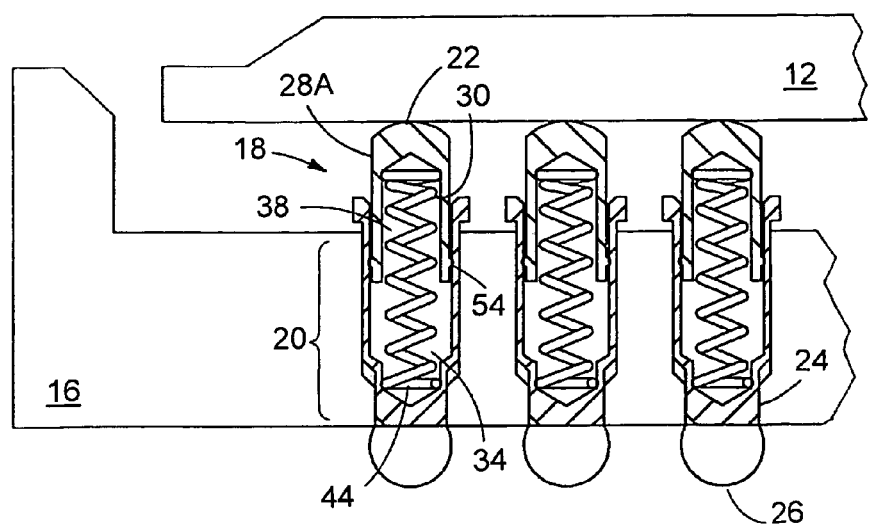
FIG. 3A is a cross-sectional side view of socket terminal assemblies with an alternate pin embodiment.
Figure 3B:
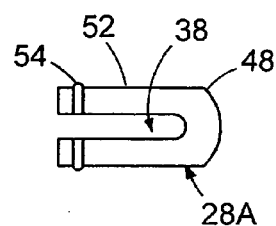
FIGS. 3B and 3C are, respectively, a side view and an end view of the pin of FIG. 3A.
Figure 3C:
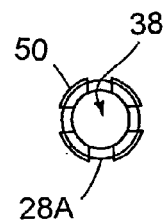

Referring to FIGS. 3A-3C, a socket terminal assembly 18 includes the features discussed above and has a pin 28A configured to increase direct contact between the socket shell 24 and the pin 28A. The pin 28A is a contact spring with four spring leaves 50 biased radially outward. The spring leaves 50 each include a main body 52 with a protrusion 54 extending radially outward from the main body 52. Socket terminal assemblies 18 can be made with alternate numbers and configurations of spring leaves 50 that facilitate electrical contact between the pin 28A and the socket shell 24. The main body 52 of each spring leaf 50 is integrally formed with head 48 of pin 28A.

Pins 28A can be manufactured through a combined stamping and forming process, through a screw machining process, or another appropriate manufacturing process. For example, a flat piece of beryllium-copper can be stamped to form flat pre-pins with multiple fingers extending radially outward from a central base. In a subsequent forming process, the fingers are bent upwards relative to the central base to form the spring leaves 50 of a pin 28A. During this forming process, the fingers can also be bent such that, in cross-section, the resulting spring leaves 50 collectively have a circular inner surface and a circular outer surface. In another example, a screw machining process can be used to bore a central cavity along the axis in a cylindrical beryllium-copper pre-pin. Slots can then be cut in the walls of the such that the remaining portions of the walls forms the spring leaves 50.

Figure 4:
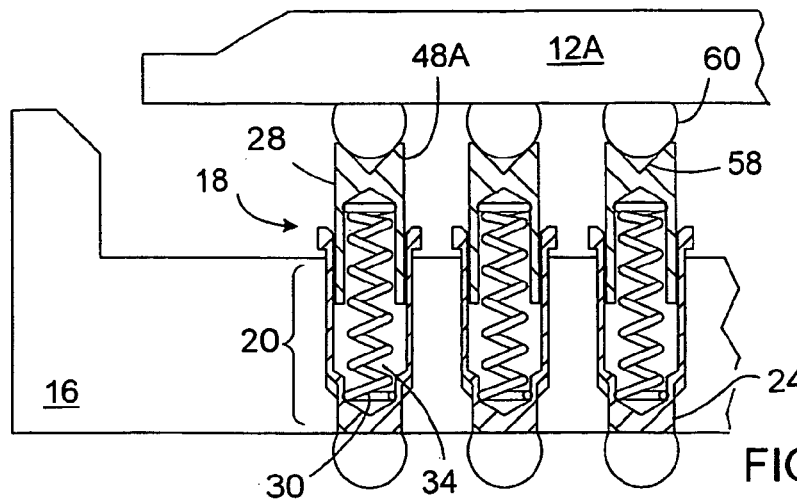
FIGS. 4-6 are cross-sectional side views of socket terminal assemblies with pins having alternate embodiments of the pin heads.
Figure 5:
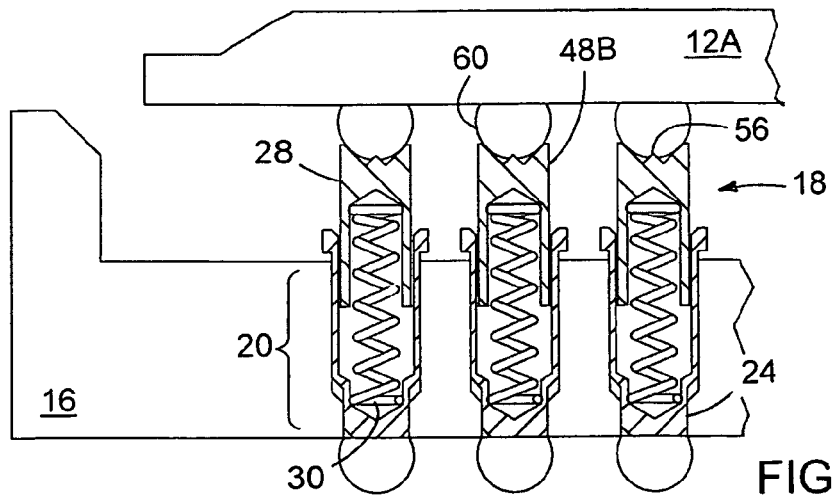
Figure 6:
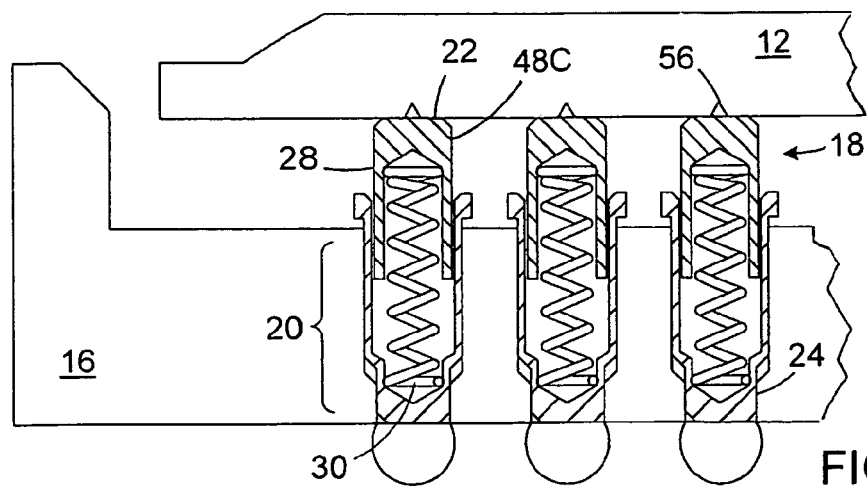

Alternate heads 48 can be provided for the pins. For example, referring to FIGS. 4 and 5, pins 28 have heads 48A, 48B each defining a concave surface 58 to receive a corresponding ball 60 of a BGA integrated circuit package 12A. Heads 48B include upwardly directed sharp protrusions 56 that can pierce materials (e.g., oxide layer) on the surface of the balls 60 to increase electrical conductivity between the pins 28 and the corresponding balls 60. Referring to FIG. 6, heads 48C for contacting a LGA integrated circuit package 12 include similar upwardly directed sharp protrusions 56 to increase electrical conductivity between the pins 28 and the contacting areas 22 of the LGA circuit package 12.

Figure 7:
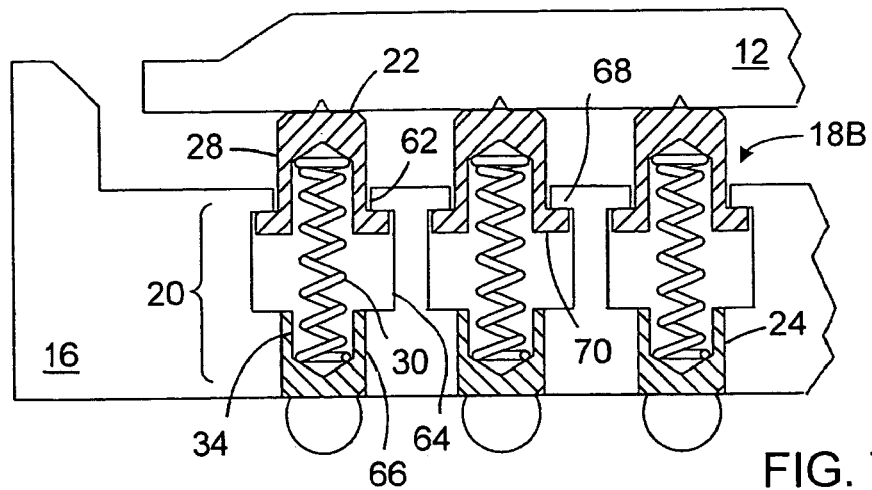
FIG. 7 is a cross-sectional side view of a portion of a socket converter assembly with a second embodiment of the socket terminal assemblies.

Referring to FIG. 7, in an alternate embodiment, each socket terminal assembly 18B has a socket shell 24 and a pin 28 that are spaced apart from each other. Consequently, the coiled spring 30 provides the sole electrical connection between the socket shell 24 and the pin 28 in this embodiment. Each hole 20, defined by the insulative member 16, has an upper portion 62, an intermediate portion 64, and a lower portion 66. The upper portion 62 has a smaller diameter than the intermediate portion 64, in effect, forming an inwardly-extending lip 68 at the upper end of the hole 20. These lips 68 limit the expansion of the socket terminal assemblies by engaging outwardly-extending tabs 70 on the lower ends of the pins 28. Consequently, press-fit engagement of the coiled springs 30 with the socket shells 24 and the pins 28 is optional in this embodiment. The lack of engagement between socket shells 24 and pins 28 enables easy assembly of socket terminal assemblies of this embodiment. However, the lips 68 increase the minimum spacing between pins (e.g., to about 0.1 millimeter).

Figure 8:
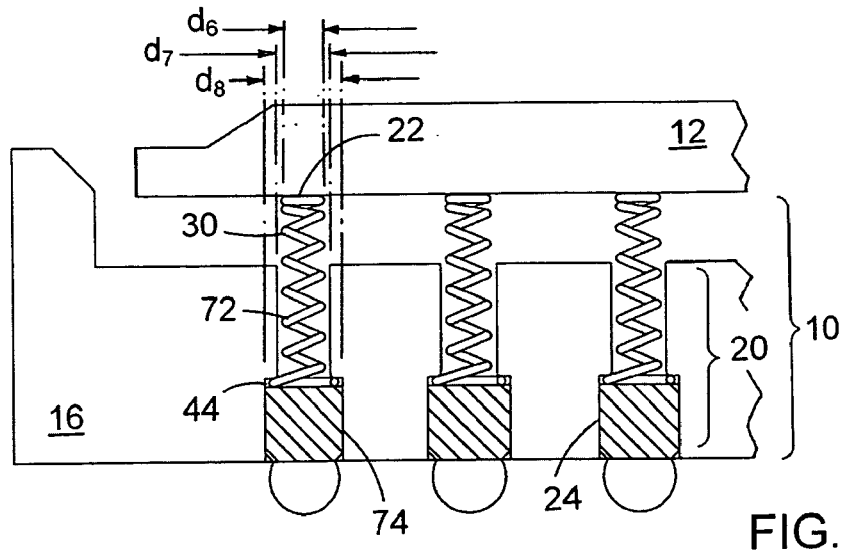
FIG. 8 is a cross-sectional side view of a portion of a socket converter assembly with a third embodiment of the socket terminal assemblies.
Figure 9:
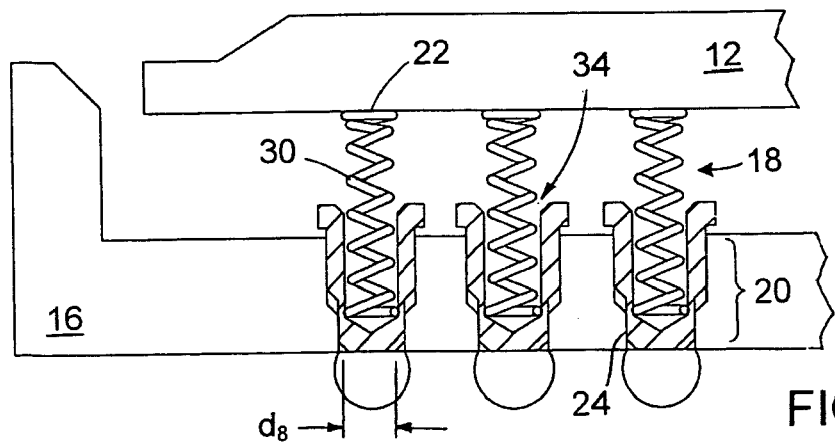
FIG. 9 is a cross-sectional side view of a portion of a socket converter assembly with a fourth embodiment of the socket terminal assemblies.

Referring to FIG. 8, in an alternate embodiment, intercoupling component 10 includes a socket support member 16 defining a plurality of holes 20 extending from its lower surface to an opposing upper surface. Each hole 20 receives a socket shell 24, having a first end configured to contact the corresponding connection region of the substrate, and a coiled spring 30. Each coiled spring 30 has a first end section 44 having an unconstrained first spring diameter (not shown) and an intermediate spring section 72 having an intermediate spring diameter d6, the first spring diameter being larger than the intermediate spring diameter. Each hole has a first opening section 74 and a second opening section 76, a second opening diameter d7 of the second opening section being larger than the intermediate spring diameter d6 and smaller than the first spring diameter d8. Each coiled spring 30 is received in the corresponding hole with the first spring section 44 received in the first opening section 74 and interposed between the corresponding socket shell 24 and the second opening section 76. The intermediate spring section 72 extends into the second opening section 76. Thus, the coiled spring 30 is secured in place between the socket shell 24 and the second opening section 76. Alternatively, referring to FIG. 9, each socket shell 24 can extend through a hole 20 with the coiled spring 30 press-fit into a socket shell 24 defining a shell cavity 34 with an inner diameter d8 less than the unconstrained first spring diameter (not shown) of the coiled spring thus frictionally securing the coiled spring to the socket shell. In use, the coiled springs 30 in these embodiments extend from corresponding socket shells 24 to contact areas 22 on the integrated circuit package 12. By having the coiled springs 30 directly contact the integrated circuit package 12, socket terminal assemblies of these embodiments require fewer parts and less assembly. However, routing electrical signals through the coiled springs 30 results in a longer signal path than can be achieved in the socket terminal assemblies of embodiments illustrated in FIGS. 2-6.

Figure 10A:
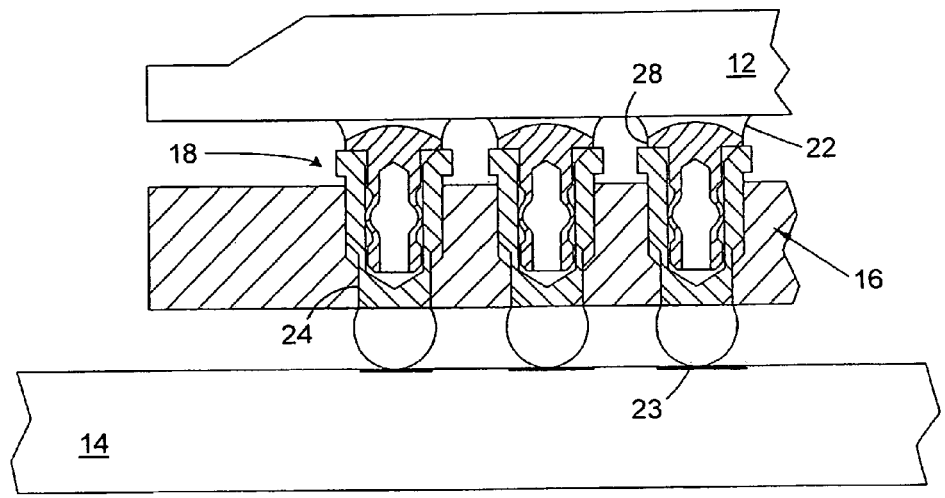
FIG. 10A is a cross-sectional side view of a portion of a socket converter assembly with a fifth embodiment of the socket terminal assemblies.
Figure 10B:
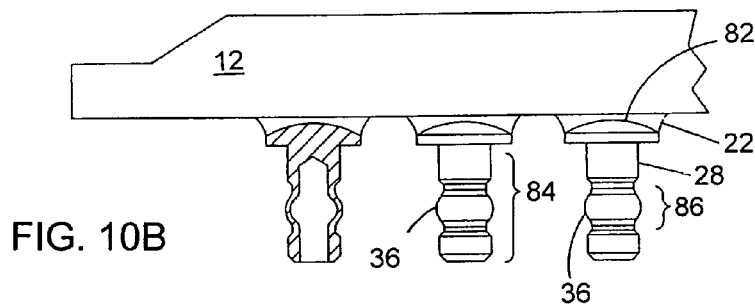
FIGS. 10B-10C are cross-sectional side views of, respectively, the pins and the socket shells of the socket terminal assemblies of FIG. 10A.
Figure 10C:
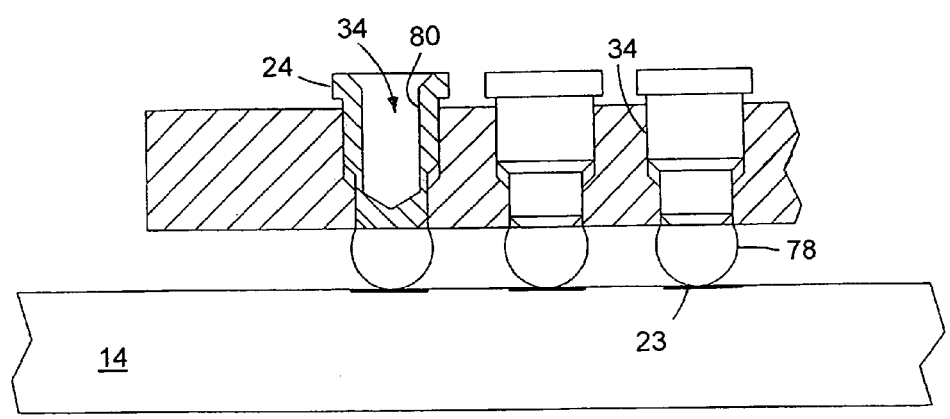

Referring to FIGS. 10A-10C, an alternate embodiment of a socket terminal assembly has a socket shell 24 and a pin 28. The socket shell 24 has a first end 78 configured to contact the corresponding connection region 23 of the substrate 14 and a second end 32 with a socket shell cavity 34 defined by at least one sidewall surface 80. The pin 28 has a first end 36 configured to be received within the socket shell cavity 34, a second end 82 adapted to contact the electrical contacting area 22 of the integrated circuit package 12, and a surface with cylindrically-shaped region 84 between the first and second ends. The cylindrically-shaped region 84 has a resilient region 86 that is configured to deform so as to apply a outwardly-directed radial force when it is press-fit within the socket shell cavity 34. This brings the resilient region 86 into contact with the at least one sidewall surface 80 and applies a force substantially normal to the at least one sidewall surface generates a frictional force sufficient to retain the pin 28 within the socket shell cavity 34. In this embodiment, the spring extends completely around the circumference of the surface of the cylindrically-shaped region of the pin. In other embodiments, the spring is in the form of a hemispherically-shaped member extending from the surface of the cylindrically-shaped region of the pin.

Figure 11A:
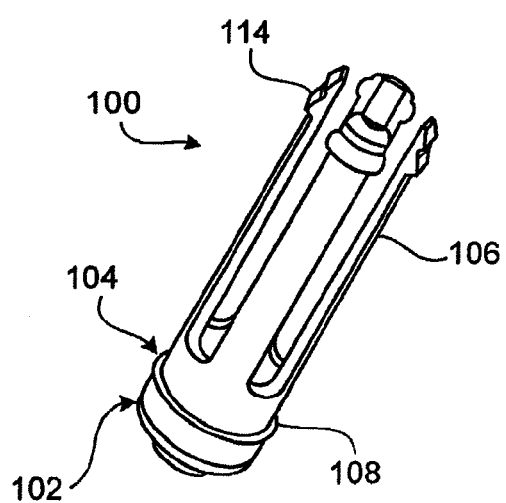
FIGS. 11A, 11B, and 11C are, respectively, an assembled perspective view, a cross-sectional side view, and an end view of another embodiment of a pin.
Figure 11B:
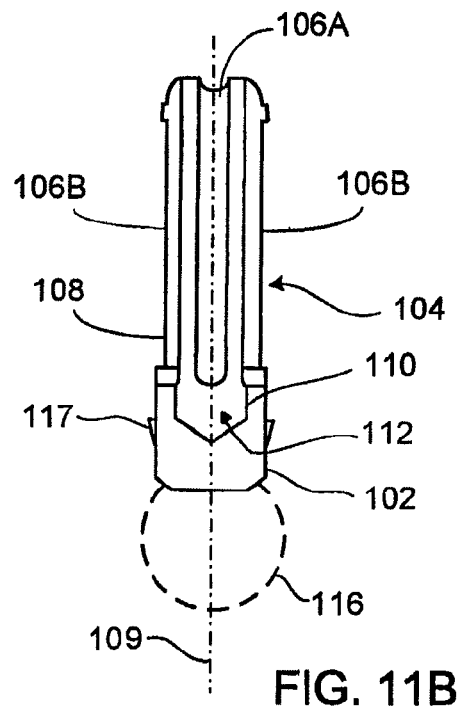
Figure 11C:
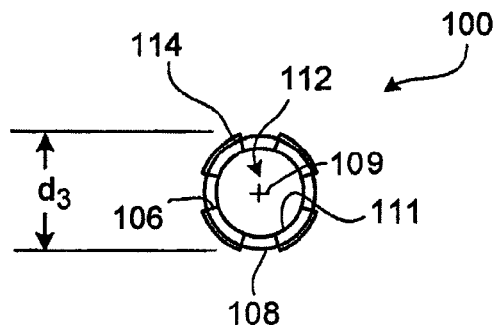

Referring to FIGS. 11A-11C, in another embodiment of a male contact, a pin 100 is substantially similar to pin 28A as shown in FIGS. 3B and 3C except that pin 28A is of unitary construction and pin 100 includes a head 102 and a separate pin body 104 with head 102 engaging pin body 104. Spring leaves 106 of pin body 104 extend from base 108 of pin body 104. Pin body 104 has a circular cross-section with spring leaves 106 having arcuate inner surfaces 111 (FIG. 11C). Arcuate inner surfaces are substantially parallel to axis 109 (FIG. 11B) of pin 100. Spring leaves 106 include protrusions 114 extending radially outward.

Spring leaves 106 have a natural resonant frequency having a value that depends in part on the length of the spring leaves. In some circumstances, operating conditions with characteristics matching that natural resonant frequency can cause vibrations that can interfere with signal transmission between pin 100 and a receiving socket. In this embodiment, spring leaves 106A are shorter than spring leaves 106B (see FIG. 11B). This is thought to reduce the likelihood of signal loss due to such vibrations because the shorter spring leaves 106A will have a different natural resonant frequency than longer spring leaves 106B.

Head 102 can have a hollow interior cavity 112 sized to receive an engagement portion 110 of base 108. In this embodiment, head 102 and pin body 104 can be held together by frictional engagement between surfaces of the interior cavity 112 of head 102 and the engagement portion 110 of the pin body 104. In some instances, attachment by frictional engagement allows the replacement of head 102. In some embodiments, head 102 and pin body are held together by other attachment mechanisms (e.g., head 102 can be soldered to pin body 104 or head 102 can be bonded to pin body 104 using an electrically conductive adhesive). Head 102 can optionally include additional contact features including, for example, a solder ball 116 or other suitable contact features. Head 102 can also have raised features 117 extending radially outward. As discussed in more detail below, raised features 117 can engage the sides of an aperture in which pin 100 is installed as part of an intercoupling component.

Head 102 and pin body 104 are both formed of electrically conductive materials (e.g., beryllium-copper, brass, phosphorus-bronze, or other suitable materials). The attachment between head 102 and pin body 104 provides an electrical connection between head 102 and pin body 104.

Figure 12:
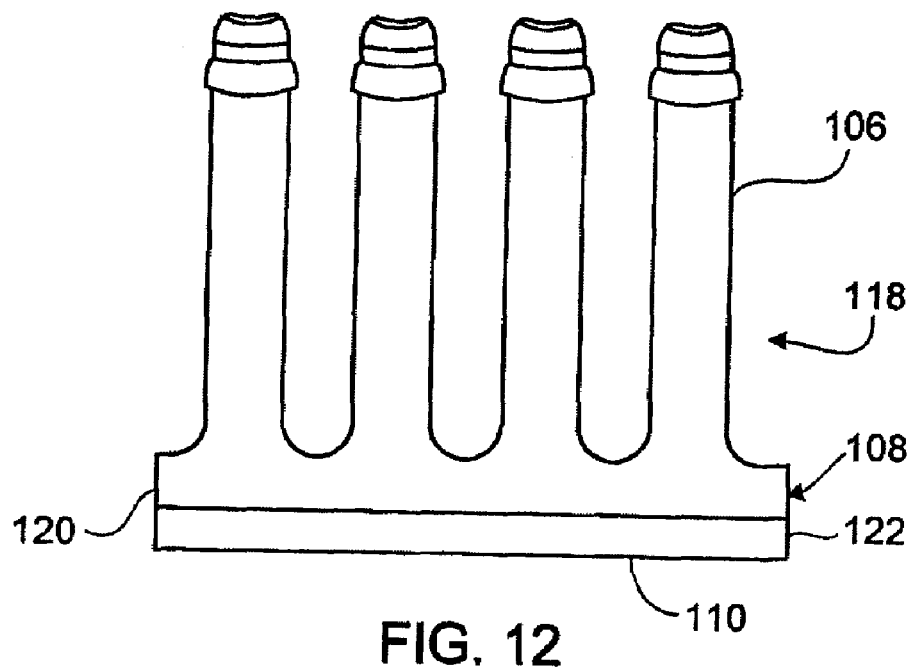
FIG. 12 is a plan view of an embodiment of a pre-pin body.

Head 102 and pin body 104 are formed separately and then assembled together to produce pin 100. Head 102 can be formed using a screw machining process or other suitable process and pin body 104 can be formed by a stamping process or other suitable process. For example, referring also to FIG. 12, a flat piece of beryllium-copper can be stamped to form flat pre-pins 118 with multiple (two, three, four, or more) spring leaves 106 extending outward (e.g., perpendicularly) from base 108. In a subsequent forming process, pre-pins formed (e.g., pressed around a cylindrical mandrel) into a cylindrical shape thus bringing a first end 120 towards (e.g., into contact with) second end 122. Thus, the resulting spring leaves 50 collectively have a circular inner surface and a circular outer surface. A screw machining process can be used to form head 102 from a brass cylinder (e.g., bore interior cavity 112, shape raised features 117). The pin body 104 can then be press-fit into interior cavity 112 of head 102. The engagement between the pin body 104 and the head 102 can both provide an electrical contact and also provide structural support to help maintain pin body 104 in a cylindrical configuration.

In some instances, forming head 102 separately from pin body 104 can facilitate forming pin 100 with a small outer diameter (e.g., less than about 0.020 inch, less than about 0.015 inch, or less than about 0.010 inch). Pins with small outer diameters can enable increased density on intercoupling components. Similarly, forming head 102 separately from pin body 104 can facilitate forming pin 100 having spring leaves with arcuate inner surfaces 111. In some instances, spring leaves with arcuate inner surfaces can have increased flexibility and improved wiping contact between pin 100 and a corresponding socket.

Forming head 102 separately from pin body 104 can also provide more efficient manufacturing as each part of pin 100 can be produced using forming techniques most appropriate to the particular part. In some instances, different heads 102 configured for contact with different surfaces (e.g., BGA packages or LGA packages) can be easily attached to a standard pin body 104.

Figure 13A:
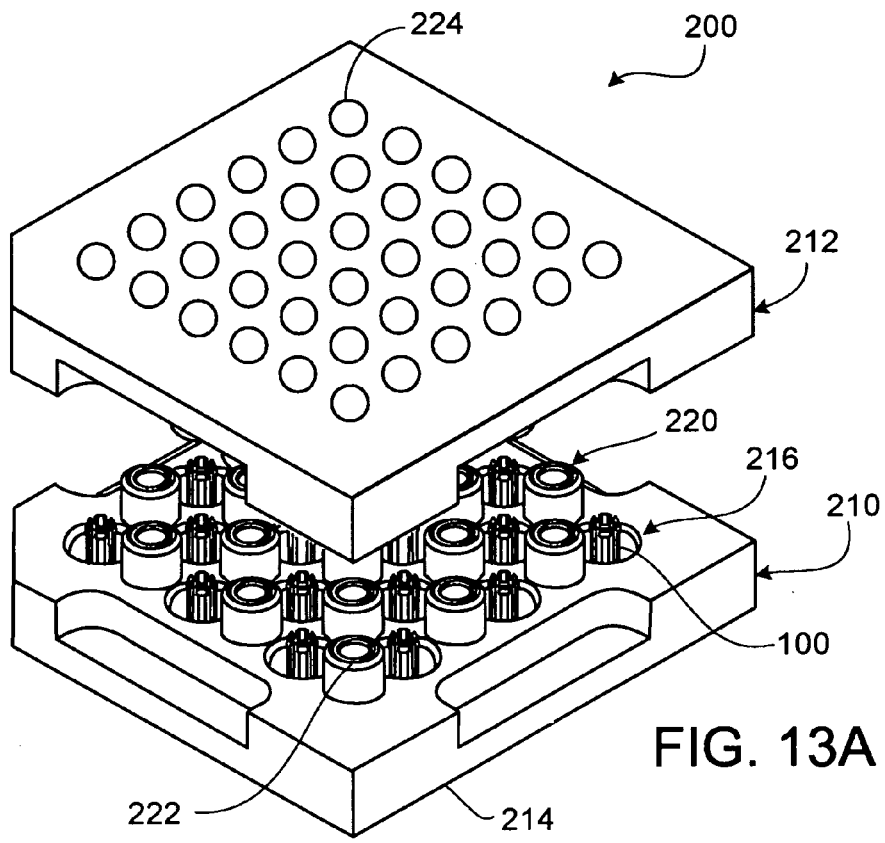
FIGS. 13A and 13B are, respectively, assembled and exploded perspective views of another embodiment of a socket converter assembly.
Figure 13B:
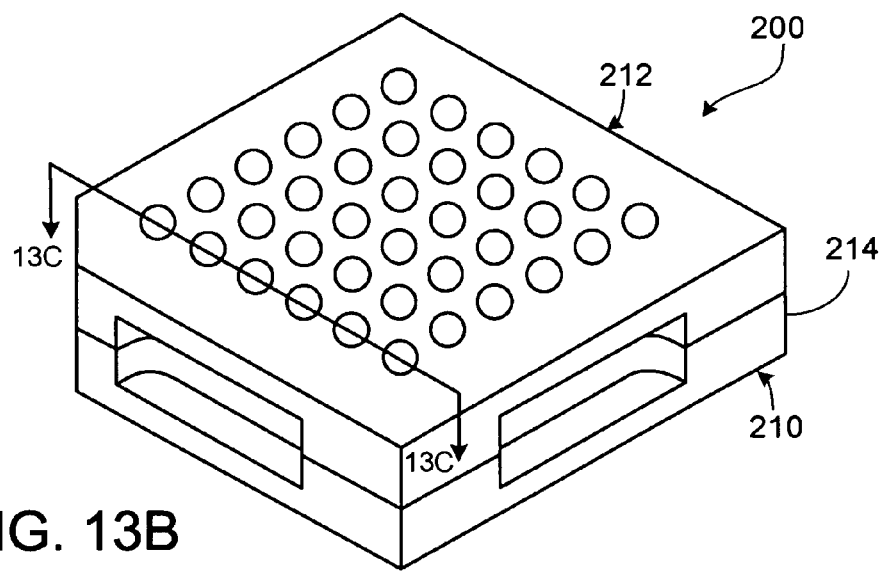
Figure 13C:
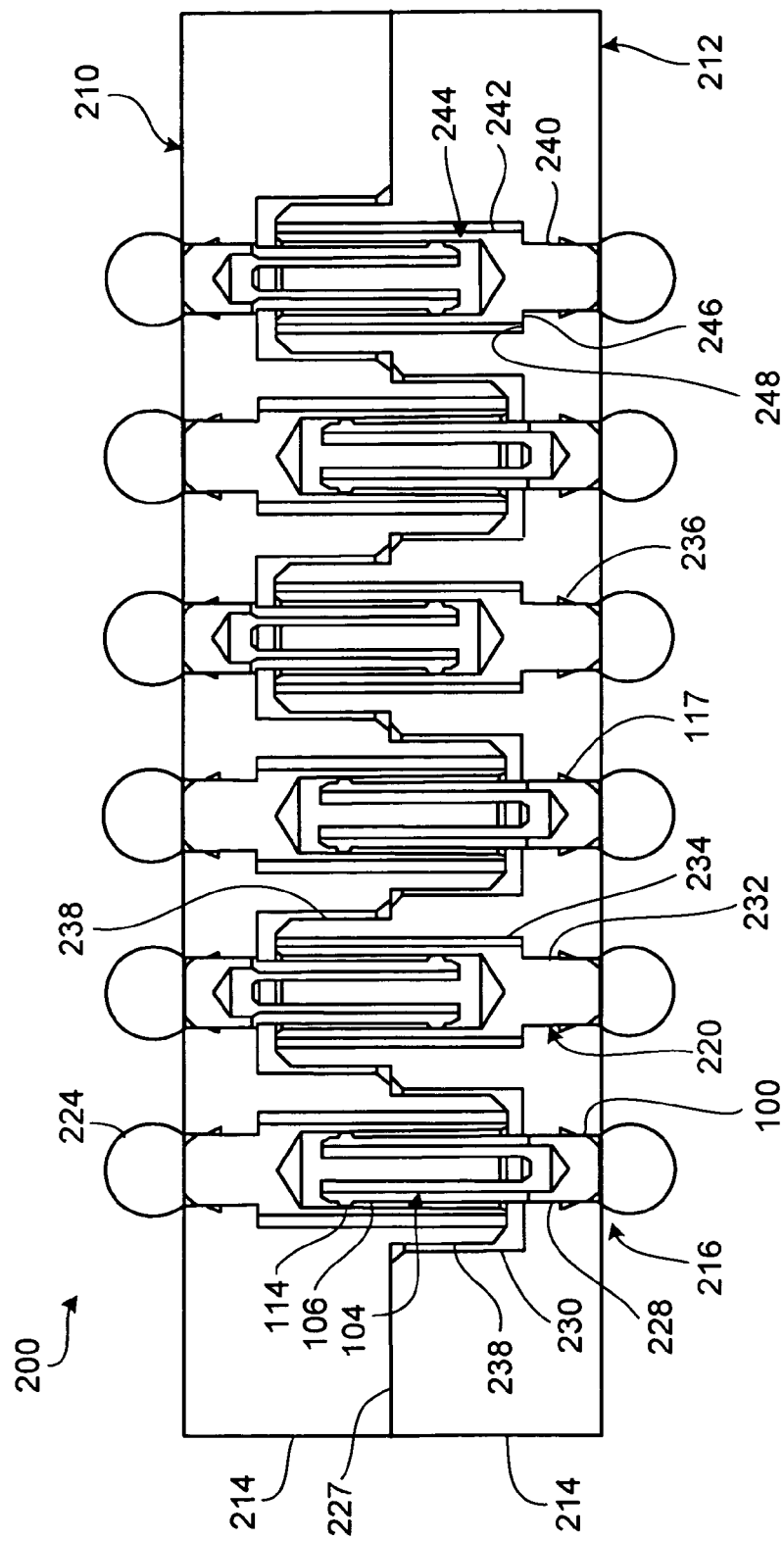
FIG. 13C is a cross-sectional side view of the socket converter assembly of FIG. 13B taken along line 13C-13C.

Referring to FIGS. 13A-13C, in another embodiment, an intercoupling component 200 can be implemented using pins 100. Intercoupling component includes mating connector assemblies 210, 212. Intercoupling component 200 can be used, for example, to provide semi-permanent connections between electrical components. For example, connector assembly 210 can be soldered to a first electrical component such as printed circuit board and mating connector assembly 212 can be soldered, for example, to IC packages intended for use with the circuit board that are separately manufactured from the circuit board. The mating connector assemblies 210, 212 can then provide convenient attachment of the IC packages to the circuit board.

Insulative member 214 of connector assembly 210 has an array of first apertures 216 sized and configured to receive male contacts 100 and an array of second apertures 220 sized and configured to receive female contacts 222. Mating connector assembly 212 has corresponding apertures arranged such that male contacts 100 and female contacts 222 of mating connector 212 can be positioned engaging, respectively, the female and male contacts 222, 100 of connector assembly 210. In the illustrated embodiment, the array of first apertures 216 and array of second apertures 220 are arranged such that connector assembly 210 and mating connector assembly 212 have the same structural design. Thus, a single supply of connector assemblies can be used to supply both connector assemblies 210 and mating connector assemblies 212. In other embodiments, other arrangements of the first apertures 216 and second apertures 220 can be used.

In this embodiment, both male contacts 100 and female contacts 222 include solder balls 224 for attaching and electrically connecting the connector assemblies 210, 212 to the electrical components to which they are mounted. In other embodiments, other structures (e.g., solder tails, resilient members, or other appropriate connectors) can be used to attach and/or electrically connect connector assemblies 210, 212 to electrical components to which they are mounted.

Referring to FIG. 13C, first and second apertures 216, 220 of connector 212 extend from an exterior surface 226 through insulative member 214 to an opposite surface 227. In this embodiment, first apertures 216 have a first portion 228 and a second portion 230 that is countersunk to have larger dimensions (e.g., a larger inner diameter) then first portion 228. First portions 228 of first apertures 216 are sized to frictionally engage male contacts 100. Raised portions 117 of male contacts 100 enhance the frictional engagement between male contacts 100 and insulative member 214. Similarly, second apertures 220 also have a first portion 232 and a second portion 234 that is countersunk to have larger dimensions (e.g., a larger inner diameter) than first portion 232. First portions 232 of second apertures 220 are sized to frictionally engage female contacts 222. Raised portions 236 of female contacts 222 enhance the frictional engagement between female contacts 222 and insulative member 214.

Each female contact 222 includes a base 240 configured to contact an electrical component to which connectors 210, 212 are to be mounted and a receiving portion 242 extending axially from base 240. Raised portion 236 of female contact 222 extends radially outward from base 240. Receiving portion 242 has an interior cavity 244 that is sized and configured to receive a portion of a corresponding male contact (e.g., pin body 104 of male contact 100). In this embodiment, receiving portion 242 has an outer dimension (e.g., an outer diameter) that is larger than a corresponding outer dimension (e.g., an outer diameter) of base 240 such that female contact 222 has a shoulder 246. When female contact 222 is inserted into second aperture 220, shoulder 246 of female contact 222 can engage a bottom surface 248 of countersunk second portion 234 of second aperture 220.

Insulative member 214 includes projections 238 through which second apertures 220 extend. Countersunk second portions 230 of first apertures 216 are sized to receive projections 238 of insulative member 214 of mating connector 212. Thus, when connector 210 and mating connector 212 are engaged, pin bodies 104 of male contacts 100 are received in female contacts 222 as female contacts 222 and projections 238 of insulative member 214 are received in the countersunk second portions 230 of first apertures 216. The complementary structures of countersunk second portions 230 and projections 238 can provide a reduced mated height of connectors 210, 212. Projections 238 can help protect and/or structurally support female contacts 222.

Contact between female contacts 222 and pin bodies 104 causes spring leaves 106 to bend inward away from their rest positions. The bias of spring leaves 106 towards their rest positions biases spring leaves 106 towards female contacts such that protrusions 114 on spring leaves 106 provide wiping contact between male contacts 100 and female contacts 222.

Figure 14:
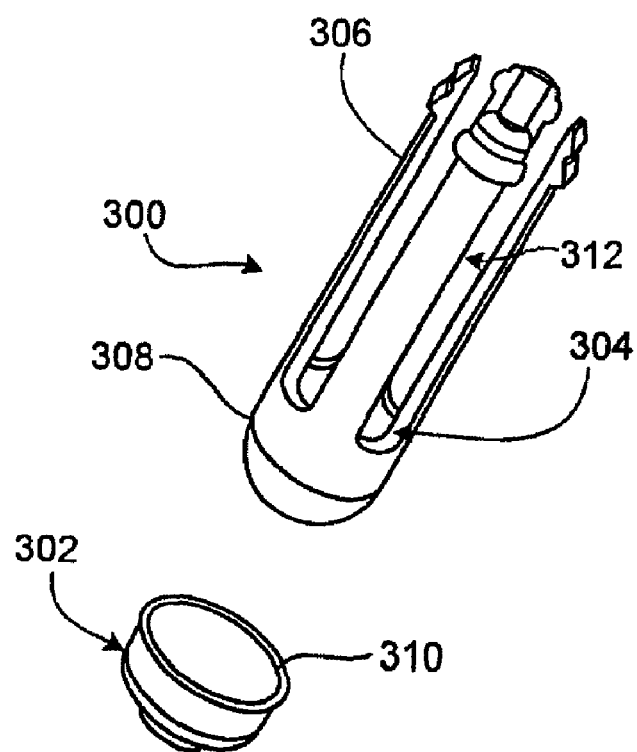
FIG. 14 is a perspective view of another embodiment of a pin.

A number of embodiments of the invention have been described. Nevertheless, it will be understood that various modifications may be made without departing from the spirit and scope of the invention. For example, referring to FIG. 14, in another embodiment of a male contact, a pin 300 is substantially similar to pin 100 (see FIGS. 11A-11C) and includes a head 302 and a separate pin body 304 with head 302 engaging pin body 304. Spring leaves 306 of pin body 304 extend from base 308 of pin body 304. Pin body 104 can have a circular cross-section with spring leaves 104 having arcuate inner surfaces 111 (FIG. 11C). However, rather than being configured with a cavity sized to receive base 308 of pin body 304, head 302 includes an engagement portion 310 that is received a hollow interior cavity 312 of base 308. Accordingly, other embodiments are within the scope of the following claims.

What is claimed is:

1. A connector assembly configured to electrically connect electrical devices, the connector assembly comprising:

a first insulating support member including a first array of apertures, each aperture of the first array extending from a first surface of the first insulating support member to an opposite second surface of the first insulating support member, each aperture of the first array configured to receive a male contact; and a plurality of male contacts for providing electrical connections arranged in a configuration corresponding with the first array of apertures, each male contact received within an opening of a corresponding aperture of the first array of apertures of the first insulating support member, each male contact having a longitudinal axis and a head configured to contact a corresponding electrical contact and a first portion extending along the longitudinal axis and configured to be at least partially received within a socket of a corresponding terminal assembly;

wherein the first portion comprises a plurality of resilient members extending axially from the head, the resilient members defining an interior cavity within the male contact, at least one of the resilient members having an inner surface that is arcuate in cross section, the inner surface extending in parallel with the longitudinal axis of the corresponding male contact;

wherein the head includes an electrical contact surface configured to contact the corresponding electrical contact, and the contact surface is disposed on an opposite side of the head relative to the first portion, and wherein the contact surface comprises a closed end of the head.

2. The connector assembly of claim 1, further comprising a plurality of sockets, the plurality of sockets for providing electrical connections arranged in a configuration corresponding with a second array of apertures included in the first insulating support member, each socket received within an opening of a corresponding aperture of the second array of apertures of the first insulating support member, each socket having an interior cavity configured to at least partially receive a male contact of the corresponding terminal assembly;

wherein each aperture of the second array extends from the first surface of the first insulating support member to the opposite second surface of the first insulating support member.

3. The connector assembly of claim 1, wherein at least one of the resilient members comprises a projection extending radially outward from the resilient member.

4. The connector assembly of claim 3, wherein the projection is disposed on the resilient member at location spaced apart from the head of the male contact.

5. The connector assembly of claim 1, wherein the resilient members of each male contact are biased towards unconstrained positions in which the arcuate inner surfaces of the resilient members are substantially parallel to a longitudinal axis of the male contact.

6. The connector assembly of claim 1, wherein the first portion is integrally formed with the head.

7. The connector assembly of claim 1, wherein the first portion is attached to the head.

8. The connector assembly of claim 7, wherein at least a portion of the head is received within the first portion.

9. The connector assembly of claim 7, wherein at least a portion of the first portion is received within the head.

10. The connector assembly of claim 1, wherein at least one of the male contacts has a circular cross-section.

11. The connector assembly of claim 1, wherein a first resilient member of the first portion has a first length and a second resilient member of the first portion has a second length that is different than the first length.

12. A male contact having a longitudinal axis, the male contact comprising:
a head configured to contact a corresponding electrical contact and a first portion extending along the longitudinal axis and configured to be received within a socket of a corresponding terminal assembly;
wherein the first portion comprises a plurality of resilient members extending axially from the head, the resilient members defining an interior cavity within the male contact, at least one of the resilient members having an inner surface that is arcuate in cross section, the inner surface extending in parallel with the longitudinal axis of the corresponding male contact;
wherein the head includes an electrical contact surface configured to contact the corresponding electrical contact, and the contact surface is disposed on an opposite side of the head relative to the first portion, and
wherein the contact surface comprises a closed end of the head.

13. The male contact of claim 12, wherein the male contact has a circular cross-section.

14. The male contact of claim 12, wherein at least one of the resilient members comprises a projection extending radially outward from the resilient member.

15. The male contact of claim 14, wherein the projection is disposed on the resilient member at a location spaced apart from the head of the resilient member.

16. The male contact of claim 12, wherein resilient members are biased towards unconstrained positions in which the arcuate inner surfaces of the resilient members are substantially parallel to a longitudinal axis of the male contact.

17. The male contact of claim 12, wherein the first portion is integrally formed with the head.

18. The male contact of claim 12, wherein the first portion is attached to the head.

19. The male contact of claim 18, wherein at least a portion of the head is received within the first portion.

20. The male contact of claim 18, wherein at least a portion of the first portion is received within the head.

21. The male contact of claim 12, wherein a first resilient member of the first portion has a first length and a second resilient member of the first portion has a second length that is different than the first length.

22. A method of manufacturing an electrical connector, the method comprising:
forming a male contact having a longitudinal axis including attaching a head configured to contact a corresponding electrical contact to a first portion extending along the longitudinal axis and comprising a plurality of resilient members, the resilient members defining an interior cavity within the male contact, each resilient member having an inner surface that is arcuate in cross section, the inner surface extending in parallel with the longitudinal axis of the corresponding male contact, the first portion sized and configured to be received in a corresponding female contact,
wherein the head includes an electrical contact surface configured to contact the corresponding electrical contact, and the contact surface is disposed on an opposite side of the head relative to the first portion, and
wherein the contact surface comprises a closed end of the head.

23. The method of claim 22, further comprising:
forming a plurality of male contacts, forming each male contact by attaching a head configured to contact a corresponding electrical contact to a first portion comprising a plurality of resilient members, the resilient members defining an interior cavity within the male contact, each resilient member having an arcuate inner surface, the first portion sized and configured to be received in a corresponding female contact.

24. The method of claim 23, further comprising:
installing the plurality of male contacts in an array of first apertures, each first aperture extending from a first surface of a first insulating support member to an opposite second surface of the first insulating support member.

25. The method of claim 24, further comprising:
installing a plurality of female contacts in an array of second apertures, each second aperture extending from the first surface of the first insulating support member to the opposite second surface of the first insulating support member.

26. The connector assembly of claim 1, wherein the contact surface is configured to abut an electrical land.

27. The connector assembly of claim 1, wherein the contact surface is configured to receive a solder ball.

28. The connector assembly of claim 1, wherein each male contact is resiliently biased relative to the insulating support member in the direction of the longitudinal axis so as to provide contact with the corresponding electrical contact.

29. The connector assembly of claim 1, wherein each male contact is configured to contact the corresponding electrical contact in an axially resilient manner.

* * * * *